United States Patent [19]

Bicknell

[11] Patent Number: 4,716,351
[45] Date of Patent: Dec. 29, 1987

[54] MOTOR MONITOR SYNCHRONIZATION SYSTEM

[75] Inventor: John Bicknell, Rudgwick, England
[73] Assignee: Bonar Bray Limited, Hertfordshire, England
[21] Appl. No.: 795,474
[22] Filed: Nov. 5, 1985
[30] Foreign Application Priority Data Nov. 8, 1984 [GB] United Kingdom ............... 8428198

[51] Int. Cl.$^4$ ............................................. G05B 19/29
[52] U.S. Cl. ............................. 318/600; 340/347 AD
[58] Field of Search ................. 318/600; 340/347 AD

[56] References Cited

U.S. PATENT DOCUMENTS

| | | | |
|---|---|---|---|
| 3,354,453 | 11/1964 | Hibbits et al. | 340/347 AD |
| 3,883,863 | 5/1975 | Willard | 340/347 NT |
| 4,377,784 | 3/1983 | Saito et al. | 324/158 MG |
| 4,568,861 | 2/1986 | Doran et al. | 315/379 |

OTHER PUBLICATIONS

T. Birch et al., "Measurement of the Phase and Magnitude etc.", CPEM 74 Conference, IEE, London, Publisher, 1–5, Jul. 1974.

*Primary Examiner*—William M. Shoop, Jr.
*Assistant Examiner*—Saul M. Bergmann
*Attorney, Agent, or Firm*—Freilich, Hornbaker, Rosen & Fernandez

[57] ABSTRACT

A magnetic field motor monitor comprises an analogue-to-digital converter arranged to provide digital representations of instantaneous values of a motor magnetic field to a digital processor. A source of clock pulses provides clock pulses for the processor. The source is synchronized to a cyclical external signal, e.g. line (mains), as follows. A timing pulse is generated after a fixed number of clock pulses and the frequency of the clock pulses provided by the source is controlled in dependence on the time difference between the occurrence of the timing pulse and a fixed phase of the cycle of the external signal.

9 Claims, 3 Drawing Figures

MOTOR MONITOR SYNCHRONIZATION SYSTEM

BACKGROUND OF THE INVENTION

This invention relates to apparatus for monitoring the performance of an electric motor.

It is known to monitor the performance of an electric motor by detecting stray magnetic flux from the motor and providing corresponding electrical signals, performing a frequency analysis of the flux signals and providing diagnostic information in dependence on variations in the flux signals. For example, for a motor powered by a 50 Hz supply, the amplitude of flux signal components at 25, 50, 100 and 150 Hz can be monitored and an alarm provided in the event of a large and sudden change. A possible frequency analysis system involves sampling the magnetic flux to determine its amplitude at a number of points within a mains cycle and processing the samples with a digital processor to determine the amplitudes of the individual frequency components of interest. In such a system the timing of the sampling points has a significant effect on the accuracy of the processing and it is important to sample the flux signals at times which are accurately related to the fundamental cycle, i.e. to the mains supply cycle. The sampling times are determined by the digital processor and it is therefore important to synchronise accurately the operation of the digital processor to the mains supply, even during possible variations in the frequency of the mains supply.

It is known to use a phase-locked loop to synchronise digital circuitry to an external signal but, particularly when there is a large ratio between the operating frequency of the digital circuitry and that to which the circuitry is to be synchronised, the cost of the synchronisation circuit is high. It is important to use low-cost circuitry in a motor monitor because it is desirable that the cost of the monitor should be small compared to that of the motor itself.

SUMMARY OF THE INVENTION

According to the invention there is provided a magnetic field motor monitor comprising an analogue-to-digital converter arranged to provide digital representations of instantaneous values of a motor magnetic field, a digital processor arranged to receive the digital representations, a source of clock pulses for the processor and means for synchronising the source to a external signal, the synchronising means comprising means for generating a timing pulse after a fixed number of clock pulses and means for controlling the frequency of the source in dependence on the time difference between the occurrence of the timing pulse and a fixed phase of the cycle of the external signal. If the frequency of the source of clock pulses tends to vary relative to that of the external signal, the time of generation of the timing pulse as a proportion of the cycle of the external signal will change and therefore the time difference will vary. The means for controlling the frequency of the clock source is arranged to alter the clock frequency in a direction which tends to reduce the relative variations and therefore very accurate synchronisation can be achieved.

Preferably the timing pulse is generated by the processor after a fixed number of clock cycles and this may advantageously be arranged by causing the processor to follow a routine which always takes the same number of clock cycles and by producing the timing pulse after the routine has been completed.

Preferably the means for controlling the frequency of the source comprise a voltage-controlled oscillator. Further, the time difference may be determined between the occurrence of the timing pulse and the zero crossing of the external signal. Preferably a pulse is generated for a time representing this time difference; this pulse may be smoothed or integrated to provide a mean control signal to the voltage-controlled oscillator.

The preferred form of the invention employs a microprocessor which is integrated with a zero crossing detector. The microprocessor is arranged to sample the flux signals after detection of the zero crossing of the mains supply and to perform a frequency analysis according to a routine which always requires the same number of microprocessor clock cycles. At the end of the routine a pulse is provided at an output port of the microprocessor and this pulse is held until the next zero crossing is detected. The pulse may be integrated and the resulting smoothed value employed to control a voltage-controlled oscillator connected to the clock input terminal of the microprocessor.

Thus it may be seen that an accurate synchronisation circuit may be constructed employing a small number of components of low cost.

BRIEF DESCRIPTION OF THE DRAWINGS

An embodiment of the invention will now be described by way of example and with reference to the accompanying drawings, in which.

DESCRIPTION OF PREFERRED EMBODIMENTS

Figure 1:
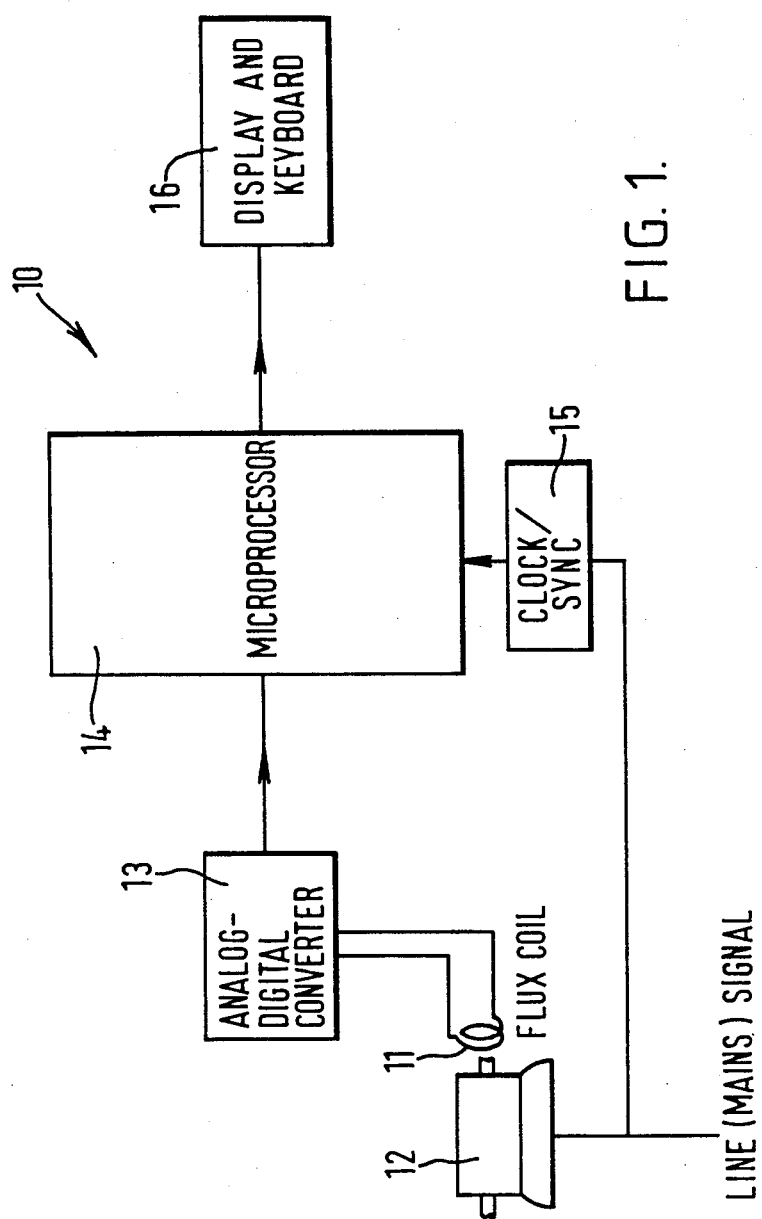
FIG. 1 is a block diagram of a motor monitor in accordance with the invention.

Referring to the drawings, the motor monitor 10 comprises a coil 11 which may be positioned so as to detect stray magnetic flux from a motor 12. Flux signals from the coil 11 are supplied to an analogue-to-digital converter 13 which supplies digital representations of the flux signals to a microprocessor 14 when commanded to do so by the microprocessor. A line (mains) signal which powers the motor 12 is supplied to a synchronisation circuit 15 which operates to synchronise the microprocessor clock pulses with the line signal as will be described. In operation, the microprocessor commands the analogue-to-digital converter to supply digital signals representing samples of the magnetic flux at instants accurately related to the line cycle. For example, a sample may be taken at times with an interval closely corresponding to fifteen degrees of the line cycle. The microprocessor performs calculations to determine the amplitudes of various frequency components of the flux signals and monitors changes in these amplitudes to provide diagnostic information which is displayed on a display 16.

Figure 2:
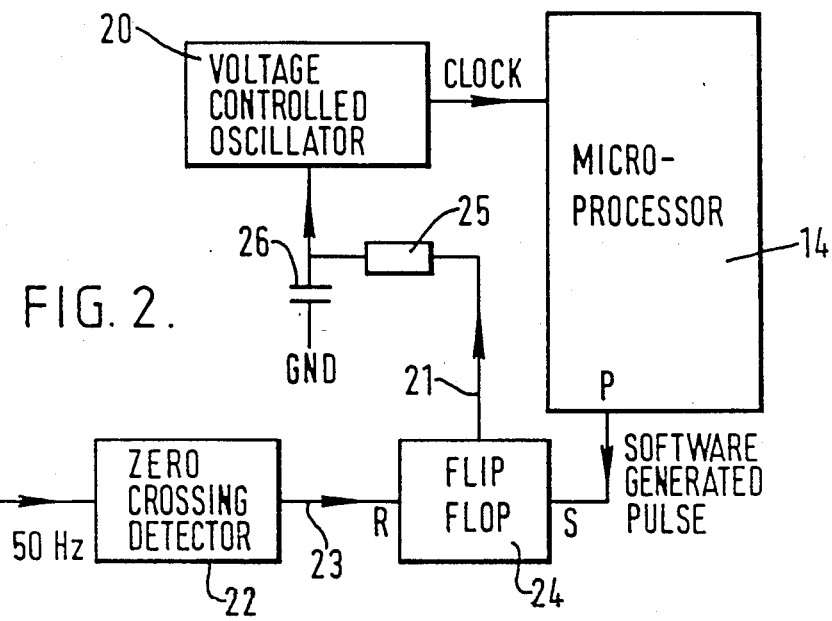
FIG. 2 is a functional diagram illustrating the principles of operation of the synchronisation system of the present invention.

FIG. 2 shows in functional terms the synchronisation circuit of the motor monitor. The microprocessor 14 is supplied with clock pulses from a voltage-controlled oscillator 20. As mentioned above, the microprocessor performs a sequence of operations in which it samples the flux signals and performs calculations thereon. After a fixed number of clock cycles the microprocessor generates a pulse P. The fixed number of cycles may be determined by a counting procedure, but preferably the sampling and calculation routine is arranged always to take the same number of clock cycles and the pulse P is provided at the end of the calculation routine. Pulse P causes a flip-flop 24 to be set so that the signal on a line 21 will be set high. The circuit also includes a zero crossing detector 22 which provides an output pulse on line 23 when the line signal passes through its zero value (fixed phase value). The signal on line 23 causes the flip-flop 24 to be reset so that the signal on line 21 will return to its former state, whereby the duration of the signal pulse on line 21 is caused to be equal to the time between the pulse P and the zero crossing time. The signal pulse on line 21 is integrated by resistor 25 and capacitor 26 and the resulting smoothed d.c. signal is applied to control the voltage-controlled oscillator 20. The direction of control is such as to maintain the signal pulse on line 21 at a constant width. In that manner the clock frequency is adjusted so that the end of the fixed number of clock cycles always occurs a fixed time before the next mains zero crossing which means that the microprocessor clock is accurately synchronised to the mains signal.

Figure 3:
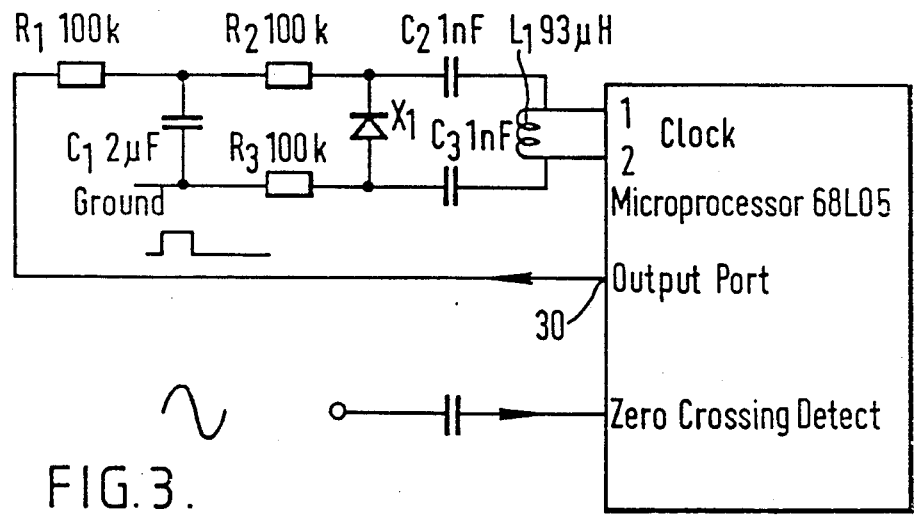
FIG. 3 is a circuit diagram showing a practical embodiment of the motor monitor synchronisation system of the present invention.

A practical circuit is shown in FIG. 3. An 8022 or 68L05 microprocessor has two clock terminals to which timing components may be connected. It is also provided with an internal zero crossing detector connected to an interrupt terminal of the microprocessor which may be polled by the program or may provide an interrupt function. In the circuit of FIG. 3 frequency control components in the form of inductance $L_1$ and varactor diode $X_1$ are connected in parallel between the clock terminals. Capacitors $C_2$ and $C_3$ are relatively large at the clock frequency (2 MHz) and provide a.c. coupling and d.c. isolation. An output port 30 of the microprocessor is connected to an integrator comprising resistor $R_1$ and capacitor $C_1$ and the resulting smoothed voltage across capacitor $C_1$ is applied across the varactor diode $X_1$ via resistors $R_2$ and $R_3$ to control the clock frequency. The signal appearing on the output port 30 is equivalent to that on line 21 in FIG. 2 and the flip-flop function of FIG. 2 is incorporated in the microprocessor. Specifically, the program in the microprocessor is arranged to set the output port 30 high at the end of the sampling and calculation routine; the interrupt terminal is then polled and when the zero crossing is detected the output port 30 is set low and the sampling and calculation routine is repeated. The sampling and calculation routine is arranged always to take the same number of clock pulses. Therefore the duration of the signal at output port 30 is equal to the time between the end of a fixed number of clock cycles and the line zero crossing. Clearly this time will vary should the microprocessor clock pulse frequency stray from synchrony with the line signal and such a tendency will result in a variation in the voltage across capacitor $C_2$ which will result in a compensating change in the clock frequency.

Thus it may be seen that the invention provides a system for synchronising a digital processor in a motor monitor to an external line signal which is sufficiently accurate yet simple and economical to construct.

I claim:

1. A magnetic field motor monitor comprising an analogue-to-digital converter arranged to provide digital representations of instantaneous values of a motor magnetic field, a digital processor arranged to receive the digital representations for analysis, a source of clock pulses for the processor, and means for synchronising said clock pulse source to a periodic external signal, said processor comprising means for generating a timing signal after a fixed number of clock pulses, said synchronising means comprising means for detecting a fixed phase of said periodic external signal and means for controlling the frequency of said clock source in dependence on the time difference between the occurrence of said timing signal and detection of said fixed phase of said periodic external signal.

2. A magnetic field motor monitor as claimed in claim 1 wherein said means for controlling the frequency of the clock source is arranged to alter the clock frequency in a direction which tends to reduce variations of the frequency of the source of clock pulses relative to that of the periodic external signal.

3. A magnetic field motor monitor as claimed in claim 1 wherein the processor is caused to follow an analysis routine which always takes the same number of clock cycles, and said timing signal is produced after said routine has been completed.

4. A magnetic field motor monitor as claimed in claim 1 wherein the means for controlling the frequency of the source comprises means for producing a control voltage proportional to said time difference between the occurrence of said timing signal and detection of said fixed phase of said periodic external signal and a voltage-controlled oscillator responsive to said control signal to reduce variations of the frequency of the source relative to the frequency of the external signal.

5. A magnetic field motor monitor as claimed in claim 4 wherein said means for producing a control voltage is comprised of means for generating a pulse for a time representing said time difference, and means for integrating each pulse to provide said control voltage to said voltage-controlled oscillator.

6. A magnetic field motor monitor as claimed in claim 1 wherein said means for detecting a fixed phase of said periodic external signal detects the zero crossing of the periodic external signal, and said time difference is determined between the occurrence of said timing signal and the detected zero crossing of the periodic external signal.

7. A magnetic field motor monitor as claimed in claim 6 wherein said digital processor comprises a microprocessor and said zero crossing detector is an element of said microprocessor.

8. A magnetic field motor monitor as claimed in claim 1 wherein said fixed phase of said periodic external signal is a zero crossing, said source of clock pulses is comprised of a voltage controlled oscillator, and said digital processor comprises a microprocessor synchronised in operation by clock pulses from said source which is arranged to sample the flux signals after detection of a zero crossing of the external signal, to perform a frequency analysis according to a routine which always takes the same number of clock cycles, and to provide at an output port a feedback signal at the end of said routine, which changes from a first value to a second value at the end of said routine and changes from said second value to said first value when the zero crossing is detected, and means for continually integrating said feedback signal to provide an integrated signal to control said voltage-controlled oscillator.

9. A magnetic field motor monitor as claimed in claim 8 wherein said integrator is comprised of a resistor and a capacitor, and said voltage controlled oscillator is comprised of an inductor and a variable capacitance diode connected in parallel with said inductor by dc isolation capacitors, said inductor being connected in the clock circuit of said microprocessor.

* * * * *